US006542047B2

(12) United States Patent
Chen et al.

(10) Patent No.: US 6,542,047 B2
(45) Date of Patent: Apr. 1, 2003

(54) NINETY DEGREE SPLITTER WITH AT LEAST THREE WINDINGS ON A SINGLE CORE

(75) Inventors: Lu Chen, Brooklyn, NY (US); Radha Setty, Staten Island, NY (US); Daxiong Ji, Brooklyn, NY (US)

(73) Assignee: Mini-Circuits, Brooklyn, NY (US)

( * ) Notice: Subject to any disclaimer, the term of this patent is extended or adjusted under 35 U.S.C. 154(b) by 50 days.

(21) Appl. No.: 09/729,380

(22) Filed: Dec. 5, 2000

(65) Prior Publication Data

US 2002/0067223 A1 Jun. 6, 2002

Related U.S. Application Data

(60) Provisional application No. 60/188,799, filed on Mar. 13, 2000.

(51) Int. Cl.[7] ................................. H01P 5/16
(52) U.S. Cl. ....................................... 333/119; 336/170
(58) Field of Search ............................... 333/118, 119; 336/170

(56) References Cited

U.S. PATENT DOCUMENTS 3,869,585 A * 3/1975 Snyder ....................... 333/118
5,280,648 A * 1/1994 Dobrovolny ............ 333/119 X

FOREIGN PATENT DOCUMENTS

JP 57-68917 * 4/1982 ................ 333/119

* cited by examiner

Primary Examiner—Justin P. Bettendorf

(57) ABSTRACT

A 90 degree splitter which covers a wide frequency range of 1500 to 2500 Mhz in a small footprint of only 0.2 inches by 0.2 inches. This device does not use any capacitors which greatly simplifies the construction and lowers the cost in comparison to conventional splitters.

11 Claims, 3 Drawing Sheets

US 6,542,047 B2

NINETY DEGREE SPLITTER WITH AT LEAST THREE WINDINGS ON A SINGLE CORE

This application claims the benefit of provisional application No. 60/188,799, filed Mar. 13, 2000.

BACKGROUND OF THE INVENTION

1. Field of the Invention

The present invention relates to hybrid splitters and more particularly to microwave 90 degree splitters.

2. Description of the Related Art

Conventional ninety degree couplers are typically large, having a footprint substantially larger than two inches by two inches.

A conventional 90 degree splitter is shown in FIG. 1. It consists of two transformers T1 and T2 and four capacitors C1, C2, C3 and C4. Typically, the transformer is made by winding twisted wires onto a one hole toroid core. Transformer T1 has wires 11 and 12. Transformer T2 has wires 13 and 14. The connection between two transformers is usually made by soldering the wires from the two transformers together with solder joints SJ1 and SJ2 and then to a grounded capacitor C3, C4 or welding the wires to a common metal pad which has a capacitor connected to a ground G.

Various examples of power splitters are known in the art. U.S. Pat. Nos. 4,789,845, 4,173,742, 4,182,996 and 5,430,418 show power splitters.

As the frequency of operation increases, the values of the capacitors goes down and it becomes difficult to realize them as lumped elements. In general C3 and C4 are smaller than C1 and C2.

SUMMARY OF THE INVENTION

It is an object of the present invention to provide a ninety degree splitter that incorporates no capacitors.

It is an object of the present invention to provide a wire wound, wide band ninety degree splitter that is functional above one gigahertz.

The present invention is a ninety degree splitter which covers a wide frequency range of 1500 to 2500 MHz in a small footprint of only 0.2 inches by 0.2 inches. This device does not use any capacitors which greatly simplifies the construction and lowers the cost in comparison to conventional splitters.

The capacitors are eliminated by substituting interwinding capacitance in the transformers used in the splitter. This eliminates the capacitors, and reduces related process such as extra soldering and welding. The result is a lower cost device with high frequency performance exceeding that obtained with conventional devices utilizing lumped capacitors.

The present invention provides a power splitter that includes a transformer with a core. A first winding (21), a second winding (23), a third winding (22) and a fourth winding (24) are wound on the core. The first and second windings are coupled to the third and fourth windings, such that the inter-winding capacitance between the windings form a third and fourth capacitance in FIG. 1. C3 and C4 are eliminated in lower frequency application.

A further embodiment of the present invention provides a power splitter that includes a transformer with a core. A first winding (31), a second winding (32) and a third winding (33) are wound on the core. The first winding is coupled to the second winding, such that the inter-winding capacitance between the first and second winding forms a first and a second capacitance. The inter-winding capacitance between the first, the second and third winding forms a third and a fourth capacitance in FIG. 1. All four capacitors are eliminated in high frequency applications.

Figure 1:
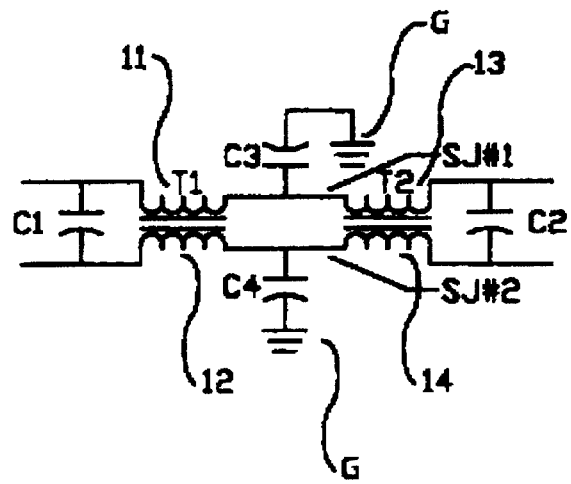
FIG. 1 is a schematic of a prior art ninety degree splitter.

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. The invention will be described with additional specificity and detail through the use of the accompanying drawings. In the drawings like numbering represents like elements between the drawings.

DETAILED DESCRIPTION OF THE INVENTION

Figure 2:
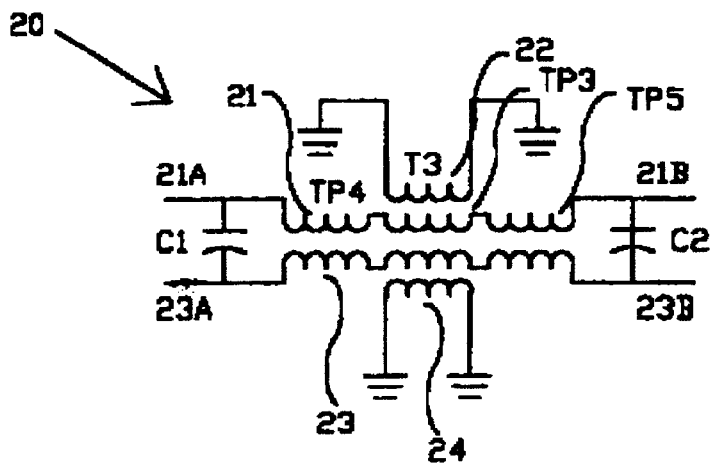
FIG. 2 is a schematic of a first embodiment of the present invention.
Figure 4:
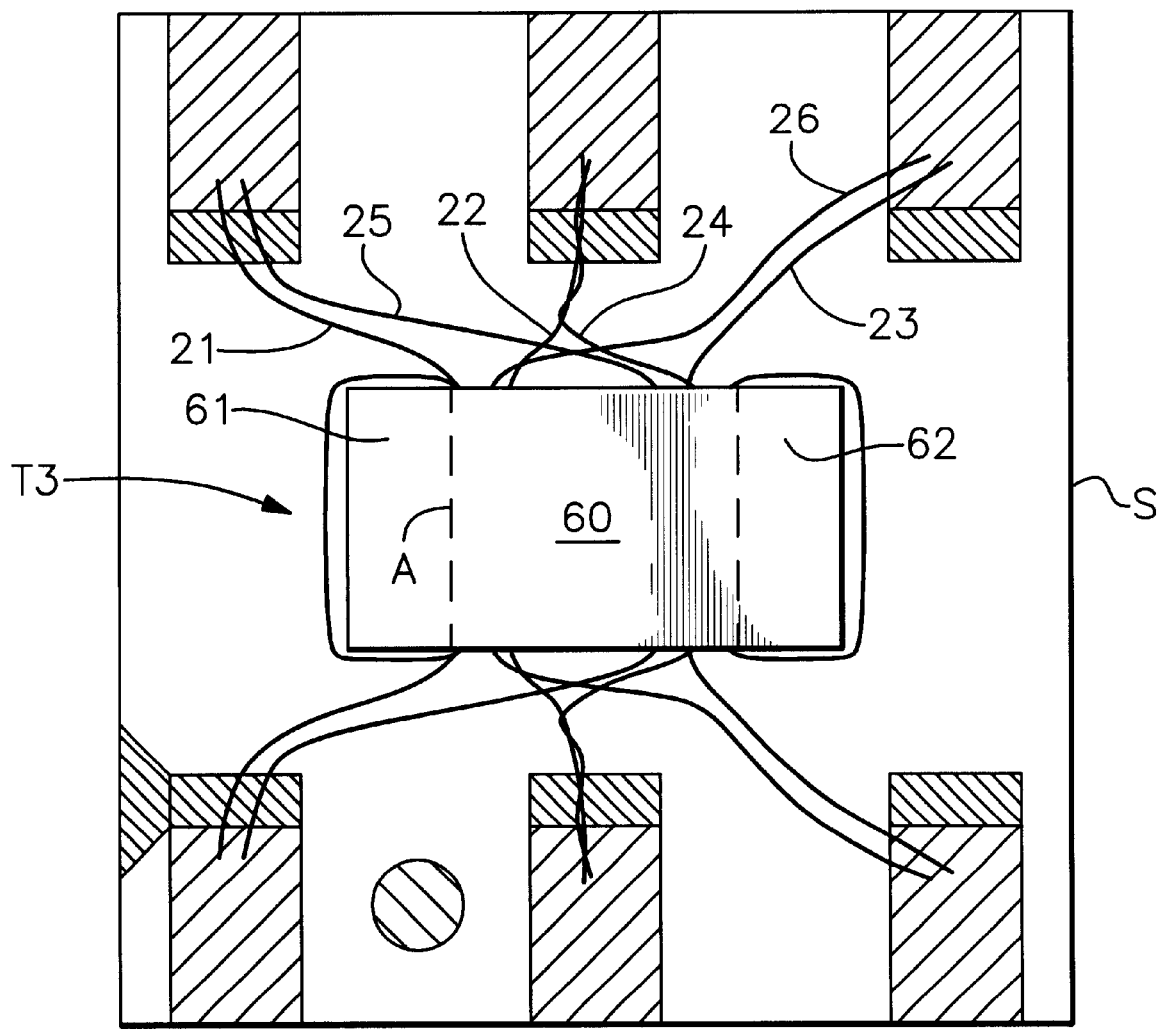
FIG. 4 is a top view of a core and wire windings of the present invention.
Figure 5:
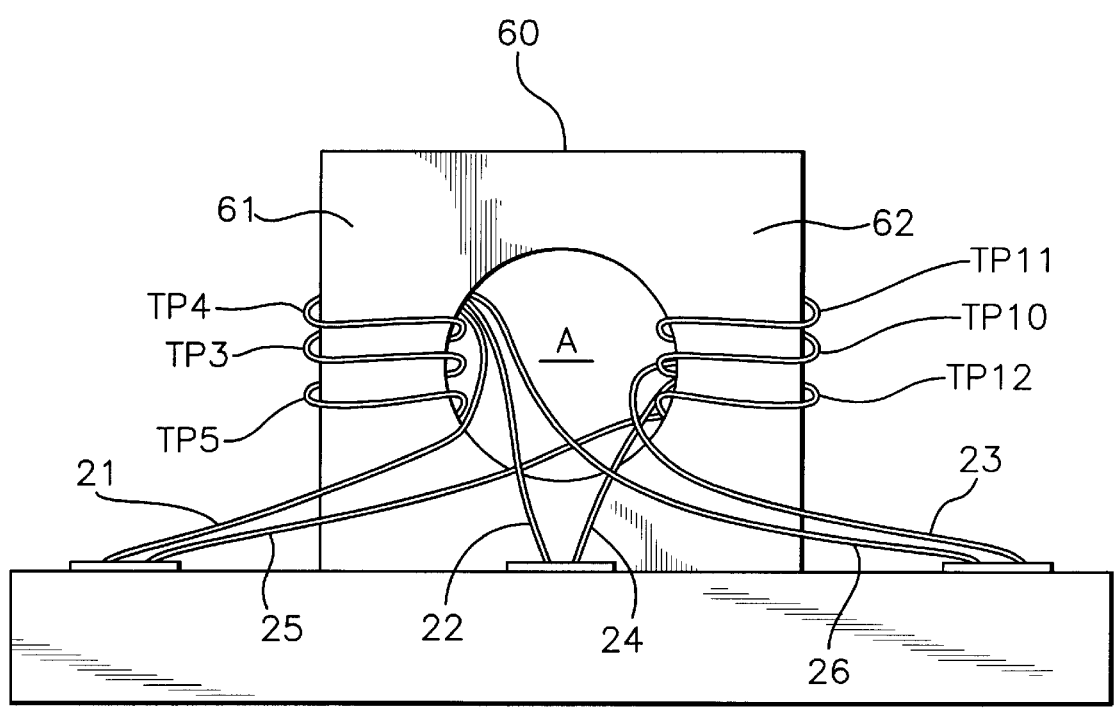
FIG. 5 is a side view of a FIG. 4.

Referring to FIGS. 2, 4 and 5, a 90 degree power splitter assembly 20 is shown. Splitter 20 has a transformer T3. Transformer T3 is formed by winding wires 21, 22, 23, 24, 25 and 26 on a magnetically permeable core 60. Core 60 is mounted to a substrate S. Core 60 has an aperture A, leg 61 and leg 62. Wires 21, 22 and 26 are wound on leg 61. All three wires are twisted together in a center portion to form a twisted three wire line, the center portion of which is wound on leg 61 to form winding TP3. Wires 21 and 26 are twisted together at each end of TP3 to form twisted pairs TP4 and TP5. Wires 23, 24 and 25 are wound on leg 62. All three wires are twisted together to form a twisted three wire line, the center portion of which wound on leg 62 to form winding TP10. Wires 23 and 25 are twisted together at each end of TP10 to form twisted pairs TP11 and TP12.

Where wire 21 of the twisted four wire line is wound around the core, a winding W5 is formed. Similarly, wire 22 forms a winding W7, wire 23 forms a winding W6 and wire 24 forms a winding W8. It is noted that the length of wires 22 and 24 wound around the core is shorter than the length of wires 21 and 23. This results in windings W7 and W8 being shorter than windings W5 and W6, or in other words, windings W7 and W8 have less turns than windings W5 and W6.

Wire 21 has two ends 21A and 21B. Wire 22 has two ends 22A and 22B. Wire 23 has two ends 23A and 23B. Wire 24 has two ends 24A and 24B. A capacitor C1 is connected between wire ends 21A and 23A. A capacitor C2 is connected between wire ends 21 B and 23B. Wires 22 and 24 have their ends connected to a ground G. Wire 22 has ends 22A and 22B connected to ground G. Wire 24 has ends 24A and 24B connected to ground G.

The new 90 degree power splitter shown in FIG. 2 has a simpler structure than that shown in FIG. 1. It contains only one transformer and two capacitors. The transformer is made by winding twisted wires to perform the function of two transformers as well as two of the capacitors found in a conventional 90 degree power splitter. The transformer supporting this type of structure functions at higher frequencies because of the reduced capacitance. In place of the two grounded capacitors C3 and C4, which are lumped elements, twisted four wire line TP3 which is part of the transformers, is substituted. The inter-winding capacitance of TP3 serves as a distributed capacitance. This structure has been used on one application to support a high frequency range of 220 to 300 MHz in a practical splitter. In the frequency range above 200 MHz, C3 and C4 of FIG. 1 can be realized as distributed capacitors using twisted magnet wires as shown in FIG. 2.

Figure 3:
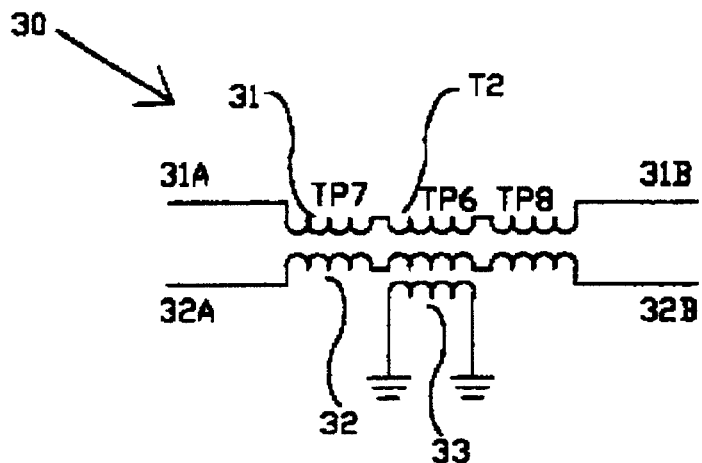
FIG. 3 is a schematic of a second embodiment of the present invention in which no tuning capacitors are employed.

Referring to FIG. 3, another embodiment of a 90 degree power splitter assembly 30 is shown. Splitter assembly 30 has a transformer T2. Transformer T2 is formed by winding wires 31, 32, and 33 on a magnetically permeable core. The core may be a toroid or may be square. Wires 31, 32 and 33 are twisted together to form a twisted three wire line TP6. Wires 31 and 32 are twisted together at both sides of TP6 to form twisted pairs TP7 and TP8. The twisted three wire line TP6 is wound onto the core and TP7 and TP8 are wound onto the core on their respective sides of TP6.

Where wire 31 is wound around the core, a winding W9 is formed. Similarly, wire 32 forms a winding W10 and wire 33 forms a winding W11. It is noted that the length of wire 33 wound around the core is less than that of wires 31 and 32. This results in winding W11 being shorter than windings W10 and W9 or in other words, winding W11 has less turns.

Wire 31 has two ends 31A and 31B. Wire 32 has two ends 32A and 32B. Wire 33 has two ends 33A and 33B. No capacitors are present as they are in FIGS. 1 and 2. Wire 33 has its ends connected to a ground G. Wire 33 has ends 33A and 33B connected to ground G.

The 90 degree power splitter assembly 30 shown in FIG. 3 is a simpler version of that shown in FIG. 2. This is a high frequency 90 degree power splitter, in which the capacitors C1 and C2 are eliminated by the inter-winding capacitance of the transformer T2. The whole 90 degree power splitter appears as a simple single transformer. The structure performs over a wide bandwidth at high frequency. The structure also has less components and less connections. This design makes it possible to place the unit in a small case with a footprint of only 0.2 inches by 0.2 inches. Experimental units have been built successfully which cover the frequency range of 1500 to 2500 MHz.

Although the illustrated embodiment showed a transformer structure for a 90 degree power splitter. It is contemplated to use the transformer structure for other phase angles and other types of signal handling devices such as filters, traps and combiners.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope as such.

What is claimed is:

1. A power splitter comprising:
a) a transformer having a core,
b) a twisted multi-wire line having a first end and a second end and consisting of a first, a second, a third and a fourth wire wound on said core,
c) a portion of said first and second wires of said multi-wire line extend beyond each end of said twisted multi-wire line to form a first and a second extension respectively, said first and second wires being twisted together in each extension and said extensions being wound around said core,
d) a first capacitor connected between the first and second wires in said first extension, and
e) a second capacitor connected between the first and second wires in said second extension.

2. The power splitter according to claim 1, wherein the twisted multi-line provides inter-winding capacitance between the wires in the line and the ground.

3. The power splitter according to claim 2, wherein, the first wire has a first and second end, the second wire has a third and fourth end, the third wire has a fifth and sixth end and the fourth wire has a seventh and eighth end.

4. The power splitter according to claim 3, wherein the fifth and sixth ends are coupled to the ground and the seventh and eighth ends are coupled to the ground.

5. The power splitter according to claim 4, wherein the first capacitor is connected between the first and third ends and the second capacitor is connected between the second and fourth ends.

6. The power splitter according to claim 1, wherein the power splitter is a ninety degree splitter.

7. A power splitter comprising:
a) a transformer having a core,
b) a first winding, a second winding, a third winding and a fourth winding wound on the core, the first winding being coupled to the second winding and the third winding being coupled to the fourth winding, such that an inter-winding capacitance between the first and second winding forms a third capacitance and the inter-winding capacitance between the fourth and third winding forms a fourth capacitance, and
c) a first and second capacitor coupled between the second and third windings.

8. The power splitter according to claim 7, wherein the first and fourth windings are connected to ground.

9. The power splitter according to claim 7, wherein the power splitter is a ninety degree splitter.

10. A power splitter comprising:
a) a transformer having a core;
b) a first, a second, and a third wire;
c) the third wire having a pair of ends that are connected to ground;
d) the first, second and third wires twisted so as to form a twisted three wire line, the twisted three wire line wound on the core;
e) the first and second wires twisted so as to form a first and a second twisted pair, the twisted three wire line connected between the first and second twisted pair; and
f) the twisted three wire line and the first and second twisted pairs wound on the core such that an inter-winding capacitance is formed between the wires of the first and second twisted pairs.

11. A power splitter comprising:
a) a transformer having a core, the core having a first leg and a second leg;

b) a first twisted multi-Wire line having a first end and a second end and having a first, a second and a third wire wound on the first leg;
c) a first portion of the first and second wires extending beyond each end of the first twisted multi-wire line to form a first and a second extension respectively, the first and second wires being twisted together in each extension and the extensions being wound around the first leg;
d) a second twisted multi-wire line having a third end and a fourth end and having a fourth, a fifth and a sixth wire wound on the second leg;
e) a second portion of the fourth and fifth wires extending beyond each end of the second twisted multi-wire line to form a third and fourth extension respectively, the fourth and fifth wires being twisted together in each extension and the extensions being wound around the second leg;
f) a first capacitor connected between the first and third extension; and
g) a second capacitor connected between the second and fourth extension.

* * * * *